United States Patent [19]

Roth et al.

[11] Patent Number: 4,662,956
[45] Date of Patent: May 5, 1987

[54] METHOD FOR PREVENTION OF AUTODOPING OF EPITAXIAL LAYERS

[75] Inventors: Scott S. Roth; Joe Steinberg; H. Scott Morgan, all of Austin, Tex.

[73] Assignee: Motorola, Inc., Schaumburg, Ill.

[21] Appl. No.: 718,758

[22] Filed: Apr. 1, 1985

[51] Int. Cl.[4] .................... H01L 21/20; H01L 21/306
[52] U.S. Cl. ............................ 148/175; 29/576 E; 148/174; 148/DIG. 7; 156/612; 156/643; 156/653; 156/657; 427/85; 427/86; 427/87
[58] Field of Search ............... 148/174, 175, DIG. 7; 29/576 E; 156/643, 653, 657, 612; 427/85-87

[56] References Cited

U.S. PATENT DOCUMENTS

| | | | |
|---|---|---|---|
| 3,559,281 | 2/1971 | Mayberry et al. | 148/175 X |
| 3,600,241 | 8/1971 | Doo et al. | 148/175 |
| 3,663,319 | 5/1972 | Rose | 148/175 |
| 3,745,423 | 7/1973 | Kasano | 148/DIG. 7 |
| 3,769,104 | 10/1973 | Ono et al. | 148/175 |
| 3,839,082 | 10/1974 | Kasano et al. | 148/DIG. 7 |
| 3,929,528 | 12/1975 | Davidson et al. | 148/175 |
| 4,209,349 | 6/1980 | Ho et al. | 148/DIG. 131 |
| 4,309,812 | 1/1982 | Horng et al. | 148/DIG. 131 |
| 4,468,857 | 9/1984 | Christian et al. | 29/577 C |
| 4,485,553 | 12/1984 | Christian et al. | 29/589 |

OTHER PUBLICATIONS

Doo et al, "Growing High Resistivity Epitaxial Films . . ." I.B.M. Tech. Discl. Bull., vol. 5, No. 2, Jul. 1962, pp. 50-51.

Bratter et al, "Dielectric Structure as an Outdiffusion Barrier" IBID., vol. No. 6, Nov. 1970, p. 1422.
B. A. Joyce, et al. "Impurity Redistribution Processes in Epitaxial Silicon Layers, " *Journal of the Electrochemical Society*, vol. 112, No. 11, Nov. 1965, pp. 1100-1106.
Dinesh C. Gupta, et al., "Advances in Silicon Epitaxial Technology," *Solid State Technology*, Oct. 1968, pp. 48-53.
D. C. Gupta, et al. "Silicon Epitaxial Layers with Abrupt Interface Impurity Profiles," Journal of the Electrochemical Society, vol. 116, No. 11, Nov. 1969, pp. 1561-1565.
G. R. Srinivasan, "Silicon Epitaxy for High Performance Integrated Circuits," *Solid State Technology, Nov. 1981, pp. 101-110.*

Primary Examiner—William G. Saba
Attorney, Agent, or Firm—John A. Fisher; Jeffrey Van Myers; David L. Mossman

[57] ABSTRACT

A method for the prevention of dopant diffusion from the back side of a doped semiconductor substrate during epitaxial layer growth. The entire surface of the substrate is first covered with a cleanly etchable material. Around the entire first layer is formed a second dopant diffusion barrier layer. The front sides of the layers are then selectively etched away to expose the front side of the substrate upon which the epitaxial layer will be grown without contamination of dopant diffusion from the sealed back side of the substrate.

6 Claims, 7 Drawing Figures

METHOD FOR PREVENTION OF AUTODOPING OF EPITAXIAL LAYERS

TECHNICAL FIELD

This invention relates generally to methods for providing epitaxial layers on doped substrates in semiconductor fabricating processes and, more particularly, to methods of preventing autodoping during the growth of such epitaxial layers and any subsequent processes used in fabrication of semiconductor devices.

BACKGROUND ART

The continuing evolution towards very large scale integrated circuit (VLSIC) and very high speed integrated circuit (VHSIC) technologies has caused exacting demands on the silicon epitaxial process in terms of reduced film thickness, minimized autodoping, low epitaxial temperatures, very low defect levels and good film uniformities. This trend applies continuous pressure on improving techniques in growing epitaxial layers on doped substrates. See for example, G. R. Srinivasan, "Silicon Epitaxy for High Performance Integrated Circuits," *Solid State Technology*, Nov. 1981, pp. 101-110.

One of the problems noted above involves the minimization of autodoping during growth of the epitaxial layers. Autodoping may be defined as undesired, uncontrolled doping of the epitaxial layer during growth where the dopant comes from an unintentional source, such as the reaction chamber, impurities in the epitaxial growth source, the susceptor used to support the wafers being processed, the doped substrate etching process or the doped substrate itself. It has been determined that out-diffusion from the doped substrate itself during epitaxial growth is the major contributor to the autodoping phenomenon. More specifically, the source of the dopant is the back side of the wafer as very little dopant is out-diffused through the front of the wafer once the epitaxial layer has started growing, under the relatively low temperature conditions (<1000° C.) employed in the current techniques. However, these conditions are still severe enough to cause gas-phase diffusion from the back side of the wafer.

FIG. 1 illustrates how epitaxial layer 10 may be contaminated by other dopants (donor or acceptors) diffusing from the back side 12 of doped substrate 14 along diffusion paths 16 during the growth of epitaxial layer 10. Autodoping is undesirable because it causes unpredictable changes in the impurity concentration profile of the epitaxial layer which can adversely affect the structure and performance of the devices to be placed on and in the epitaxial layer. It is typically preferred that the epitaxial layer be more lightly doped than the substrate.

Autodoping of epitaxial and other surface layers upon a doped substrate also occurs when the wafer is subjected to other processing typical of semiconductor device fabrication.

One prior art solution of the autodoping problem concerned altering the epitaxy growth process to minimize autodoping. In actual practice, this approach can only be partially successful in reducing autodoping during epitaxy growth and does not address autodoping which may occur during post-epitaxial layer processing. Another practiced solution has been back side capping of the substrate with a dopant diffusion barrier prior to epitaxy growth to prevent dopant diffusion out of the substrate back side. In this latter technique, the dopant diffusion barrier is deposited or grown only on the back side of the wafer, if possible, or formed on both sides of the substrate wafer and then removed only from the front side. In this discussion, the front side of the substrate will always be the side to receive the epitaxial layer.

D. C. Gupta, et al in "Silicon Epitaxial Layers with Abrupt Interface Impurity Profiles," *Journal of the Electrochemical Society*, Vol. 116, No. 11, November 1969, pp. 1561-1565 find that "back-sealing the substrates prior to deposition by using an insulating, etch-resistant film, e.g., silicon oxide, silicon nitride, etc.," significantly reduces the amount of impurity autodoping at the epitaxial layer/substrate interface. In this work, the substrate was doped with arsenic. The specific material used in back side sealing was not revealed.

However, B. A. Joyce et al in "Impurity Redistribution Processes in Epitaxial Silicon Layers," *Journal of the Electrochemical Society*, Vol. 112, No. 11, November 1965, pp. 1100-1106 find that although thermally grown oxide on the back of the substrate is considerably effective as an out-diffusion barrier for arsenic, phosphorus and antimony, some out-diffusion transfer occurs even if the substrate is completely oxidized. Further, the effectiveness of a thermal oxide film as a barrier to out-diffusion is very low in the case of gallium dopant, which is a Group III acceptor in contrast to phosphorus, arsenic and antimony which are Group V donors. Thus, it appears that although silicon oxide can serve as a dopant diffusion barrier to donors, its effectiveness varies with the particular donor and it is not completely effective for any acceptor.

Other barriers, such as silicon nitride proposed in passing by Gupta, et al noted above, have problems because they cannot be cleanly etched from the front side of the wafer. In other words, the dry etching techniques, such as plasma etching, necessary for removing silicon nitride from the front side of the wafer prior to epitaxial layer growth causes contamination and mechanical damage to the substrate front surface. Such physical defects in the surface of the substrate are well-known to propagate crystal lattice defects in the subsequent epitaxial layers, causing an inferior product.

Other layers are known to be deposited on the back side of the substrate or wafer, but these layers typically only serve as reverse bias electrode terminals. U.S. Pat. Nos. 4,485,553 and 4,468,857 to Christian et al describe a two-wafer method for manufacturing an integrated circuit device. Although multilayer protection is disclosed therein, including using a layer of silicon dioxide covered by a layer of silicon nitride, the protective layers are placed on a separate support wafer which is glued on top of a wafer which bears the semiconductor devices which have been already formed. Thus, the autodoping problem is not avoided by this technique.

BRIEF SUMMARY OF THE INVENTION

Accordingly, an object of the present invention is to eliminate or minimize autodoping of an epitaxial layer caused by dopant diffusion off of the back side of the substrate.

Another object of the present invention is to provide an autodoping prevention method which will not contaminate or physically damage the front side of the substrate on which the epitaxial layer is to be grown.

A further object of the present invention is to provide an autodoping prevention method which will protect all subsequent layers in the semiconductor fabrication after the method is applied.

Yet another object of the present invention is to provide an autodoping prevention method which may be applied to a wide variety of substrates and which may be practiced with available technology.

In carrying out the above and other objects of the invention, there is provided a method for manufacturing a semiconductor device which will protect epitaxial and subsequent layers from autodoping by forming a first layer of a cleanly etchable material over the entire exposed surface of a doped substrate. Subsequently, a second layer of a dopant diffusion barrier material is formed over the entire exposed surface of the first layer. Finally, areas where an epitaxial layer is desired to be grown are etched away.

DETAILED DESCRIPTION OF THE INVENTION

The embodiments of the present invention are explained with reference to FIGS. 2 through 7.

Figure 1:
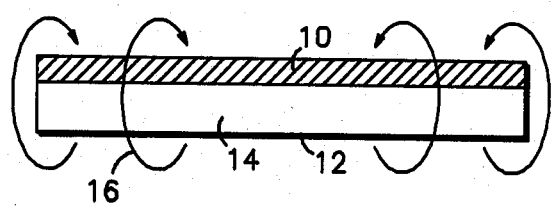
FIG. 1. illustrates a cross-section of an epitaxial layer on a doped substrate demonstrating how autodoping of an epitaxial layer may occur.
Figure 2:
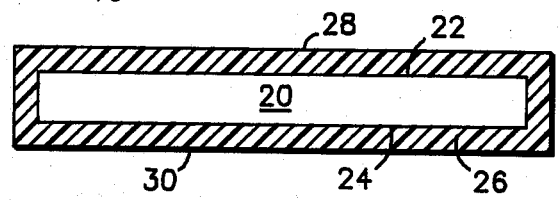
FIG. 2 illustrates a cross-section of a doped substrate completely covered by a cleanly etchable material layer.

Shown in FIG. 2 is a doped substrate or wafer 20 having a front side 22 on which will eventually be grown an epitaxial layer of the same or different conductivity type as doped substrate 20. Doped substrate 20 also has a back side 24 from which dopant impurities would be diffused if the method of this invention were not used. It will be appreciated that the drawings are not to scale in that the thicknesses of the substrate and various layers thereon have been greatly exaggerated with respect to wafer diameter for the sake of clarity.

Completely surrounding or encapsulating doped substrate 20 of FIG. 2 is a first layer 26 of cleanly etchable material. By "cleanly etchable material" is meant a substance which when etched away will leave front side 22 of doped substrate 20 smooth, unmarred and ready for epitaxial layer growth. Silicon dioxide ($SiO_2$) is a preferred substance for this cleanly etchable material. It is particularly preferred that first layer 26 be of a material which is not only cleanly etchable, but which is also a barrier against dopant diffusion. If such a material were available, the objectives of the present invention could be achieved with one protective layer. However, there are no known substances which will leave a smooth enough substrate front side surface 22 after removal and which also possess satisfactory dopant barrier diffusion properties. While silicon dioxide is a cleanly etchable material, it is not a complete dopant barrier as noted earlier, particularly with respect to acceptors. Thus, another layer is necessary. Note also first layer front side 28 and back side 30 which correspond to front side 22 and back side 24 of substrate 20.

Figure 3:
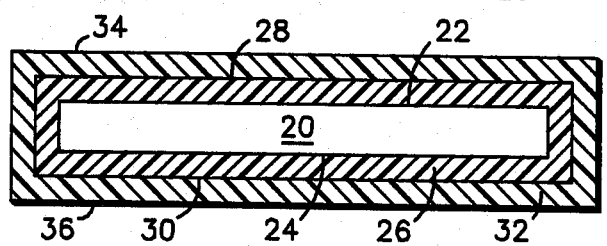
FIG. 3 illustrates a cross-section of a doped substrate completely covered by two protective layers in accordance with the present invention.

Shown in FIG. 3 is a doped substrate 20 completely surrounded or covered by first layer 26 of cleanly etchable material which in turn is completely surrounded by a second layer 32 of dopant diffusion barrier material. Note that first layer 26 covers both the front side 22 and the back side 24 of doped substrate 20, and that second layer 32 also covers both the front side 28 and the back side 30 of first layer 26. As noted, second layer 32 must be of dopant diffusion barrier material. This means that second layer 32 must be of a material which will prevent dopant impurities (donors and acceptors) from diffusing through it during high temperature processing, such as during the growth of an epitaxial layer. In addition, second layer 32 must exhibit etch properties significantly different from those of the first layer 26. Stated another way, etching procedures effective against the material of second layer 32 should not substantially etch the material of first layer 26. Likewise, etching procedures effective against the material of first layer 26 should not be substantially effective against the material of second layer 32. Materials suitable as dopant diffusion barrier materials but which also have etch properties different from silicon dioxide include, but are not limited to, silicon nitride ($Si_3N_4$) and polysilicon.

Note further that second layer 32 has a front side 34 corresponding to first layer front side 28 and doped substrate front side 22 as well as a back side 36 corresponding to first layer back side 30 and doped substrate back side 24.

Figure 4:
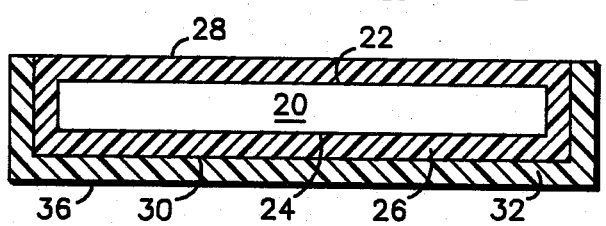
FIG. 4 illustrates a cross-section of a doped substrate of this invention which has had one side of the top protective layer etched away.

Shown in FIG. 4 is the result of the next step in the method of this invention, namely the selective etch of the front side 34 of second layer 32 without consumption of first layer 26 to any appreciable extent. For example, second layer 32 could be selectively dry etched, e.g. plasma etched, without consuming first layer 26 by adjusting the etch rate ratio between dopant diffusion barrier material of second layer 32 versus cleanly etchable material of first layer 26. As noted, dopant diffusion barrier material must be chosen so that such etch selectivity is possible. As noted earlier, since no material is known which provides both an effective and complete dopant diffusion barrier and a cleanly etchable characteristic, second layer 32 must necessarily be etched in a fashion, such as plasma etching, which is likely to cause contamination and damage to the underlying layer, namely first layer 26. However, since epitaxial layer 38 is not to be grown on first layer front side 28, no harm is done by plasma etching off second layer front side 34.

Figure 5:
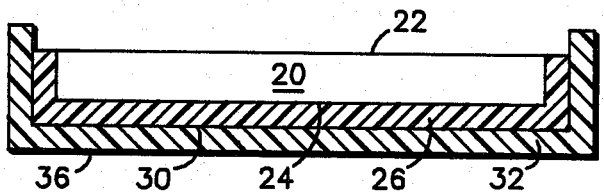
FIG. 5 illustrates a cross-section of a doped substrate where the front side of the substrate is cleanly exposed for epitaxial growth while the back side retains two protective layers in accordance with the present invention.

Shown in FIG. 5 is a cross-section of doped substrate 20 with its front side 22 exposed ready for the growth of epitaxial layer 38. Again, a requirement is that the etch of front side 28 of cleanly etchable material of first layer 26 must not mechanically damage or contaminate the exposed front side 22 of doped substrate 20. Another requirement is that the etching process must selectively or preferentially etch the material of first layer 26 without appreciably etching the material of second layer 32, particularly back side 36 of second layer 32 so that the dopant diffusion barrier remains in place.

Wet etching techniques can be designed to give the desired effects described above. For example, if the cleanly etchable material of first layer 26 is silicon dioxide (SiO$_2$) and dopant diffusion barrier material of second layer 36 is silicon nitride (Si$_3$N$_4$), then hydrofluoric acid (HF) will remove front side 28 of first layer 26 with little or no etching of the remainder of second layer 32 (which at this stage is back side 36). The hydrofluoric acid etch will not mechanically damage or contaminate the exposed substrate surface front side 22 to receive epitaxy. Note that the back side 24 of doped substrate 20 retains the back side 30 of first layer 26 and the back side 36 of second layer 32.

Figure 6:
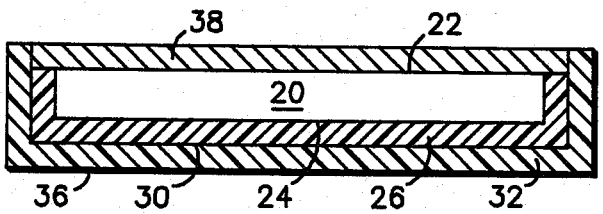
FIG. 6 illustrates a cross-section of a doped substrate, protected from autodoping, which has had an epitaxial layer grown on the front side thereof.

Shown in FIG. 6 is a cross-section of the doped substrate 20 back side protected as in FIG. 5 with epitaxial layer 38 grown on the front side 22 thereof. Note that epitaxial layer 38 may be grown on the front side 22 of doped substrate 20, which was prepared as described above, without autodoping from the back side 24 of doped substrate 20. Autodoping is prevented by one or more diffusion barriers that have remained in place on the back side 24 of substrate 20, such as the remaining back side 36 of second layer 32. These protective dopant diffusion barriers may remain on the back side 24 of the wafer or substrate 20 to provide autodoping protection throughout the remainder of integrated circuit fabrication. Note further that the front side 22 of substrate 20 has not received mechanical damage or contamination that could degrade or propagate defects in epitaxial layer 38.

In one particular embodiment of the invention, the doped substrate 20 is silicon and the epitaxial layer 38, which is to be grown by conventional techniques, is doped or undoped silicon. First layer 26 would be silicon dioxide cleanly etchable by wet techniques while second layer 32 would be silicon nitride or polysilicon etchable by plasma techniques. It is anticipated that the method of this invention would be particularly suited to gallium arsenide (GaAs) based semiconductors. It should also be noted that the autodoping prevention method of this invention may be practiced using conventional semiconductor device processing techniques in-line with conventional fabrication procedures. In other words, the manufacturing flow does not have to be interrupted to perform a custom, extraordinary autodoping prevention step. It should also be noted that the autodoping prevention procedure of the present invention can be accomplished in only a very few steps in contrast to the multiplicity of steps used in other techniques.

The thicknesses of first layer 26 and second layer 32 should preferably be adjusted by the designer to withstand all of the semiconductor fabrication steps so that they exist in effective form when the die are cut from the wafer. In this fashion layers 26 and 32 provide protection as long as possible.

Figure 7:
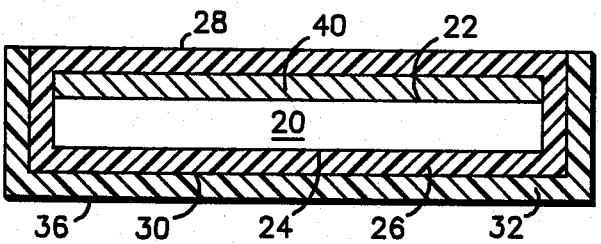
FIG. 7 illustrates a cross-section of an alternate embodiment of this invention where the autodoping prevention layers have been applied after the growth of an epitaxial layer.

Shown in FIG. 7 is an alternate embodiment of the invention in a situation where autodoping of unprotected layer 40 is not considered to be a problem. In this embodiment, first layer 26 and second layer 32 are formed (grown or deposited) after the unprotected layer 40 has been grown on the front side 22 of doped substrate 20. In the particular stage shown in FIG. 7, front side 34 of second layer 32 has already been removed. Next, the front side 28 of first layer 26 would be removed and integrated circuit fabrication would continue on the exposed front surface of unprotected layer 40. In such an embodiment, layer 40 might be an epitaxial layer which would not be protected from autodoping, although subsequent layers would be.

We claim:

1. In a method of manufacturing a semiconductor device having an epitaxial layer and subsequent layers which are not contaminated by dopants diffused from a doped substrate, the improvement comprising preparing a substrate for device formation comprising, in the order listed, the steps of:
    forming a first layer of a cleanly etchable material over front side and back side surfaces of a doped semiconductor substrate;
    forming a second layer of a dopant diffusion barrier material over front side and back side surfaces of the first layer, the second layer of dopant diffusion barrier material being provided in sufficient thickness to survive all subsequent removal steps;
    selectively etching the second layer from the front side surface without removing the first layer therefrom;
    selectively wet etching the first layer from the front side of the doped substrate without removing additional second layer dopant diffusion barrier material, to reveal a defect-free substrate surface;
    growing an epitaxial semiconductor layer on the defect-free surface on the front side of the doped semiconductor substrate; and
    retaining the second layer dopant diffusion barrier and the first layer of cleanly etchable material on the back side surface of the doped semiconductor substrate as the remaining device layers are formed and removed.

2. The method of claim 1 wherein at least one non-protected layers is present on the doped substrate before said first layer is formed.

3. The method of claim 1 wherein the cleanly etchable material is silicon dioxide.

4. The method of claim 1 wherein the dopant diffusion barrier material is selected from the group consisting of silicon nitride and polysilicon.

5. In a method of manufacturing a semiconductor device having an epitaxial silicon layer and subsequent layers which are not contaminated by dopants diffused from a doped silicon substrate, comprising preparing a substrate for device formation by the following steps in the order listed:
    forming a first layer of silicon dioxide over front side and back side surfaces of a doped silicon semiconductor substrate;
    forming a second layer of a dopant diffusion barrier material consisting of silicon nitride over front side and back side surfaces of the first layer, the second layer of dopant diffusion barrier material being provided in sufficient thickness to survive all subsequent removal steps;
    selectively dry etching the second layer from the front side surface without removing the first layer therefrom;
    selectively wet etching the first layer from the front side of the doped silicon substrate without removing additional second layer dopant diffusion barrier material, to reveal a defect-free substrate front side;
    growing a silicon epitaxial layer on the defect-free front side of the doped silicon substrate; and
    retaining the second layer of dopant diffusion barrier material and first layer of silicon dioxide on the back side of the doped silicon semiconductor substrate during the subsequent formation and partial removal of the remainder of the layers.

6. The method of claim 5 wherein one or more non-protected silicon layers is present on the doped silicon substrate before said first layer is formed.

* * * * *